(12) United States Patent
Lau et al.

(10) Patent No.: US 12,744,546 B2
(45) Date of Patent: Sep. 22, 2026

(54) BIAS CIRCUIT FOR AN ACTIVE PHASE SHIFTER

(71) Applicant: QUALCOMM INCORPORATED, San Diego, CA (US)

(72) Inventors: Wing Fat Andy Lau, San Diego, CA (US); Jeremy Darren Dunworth, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 148 days.

(21) Appl. No.: 18/747,512

(22) Filed: Jun. 19, 2024

(65) Prior Publication Data

US 2025/0392321 A1 Dec. 25, 2025

(51) Int. Cl.
*H03M 1/74* (2006.01)
*H03M 1/68* (2006.01)
*H03M 1/78* (2006.01)

(52) U.S. Cl.
CPC ............ *H03M 1/745* (2013.01); *H03M 1/68* (2013.01); *H03M 1/785* (2013.01)

(58) Field of Classification Search
CPC ......... H03M 1/68; H03M 1/745; H03M 1/785
See application file for complete search history.

(56) References Cited

U.S. PATENT DOCUMENTS

| | | | | |
|---|---|---|---|---|
| 8,184,031 | B1 * | 5/2012 | Mrozek | H04L 27/34 341/143 |
| 9,276,602 | B1 * | 3/2016 | Pagnanelli | H03M 1/1038 |
| 11,171,664 | B1 * | 11/2021 | Honarparvar | H03M 1/661 |
| 11,290,093 | B1 * | 3/2022 | Chakraborty | H01Q 3/34 |
| 11,757,455 | B1 * | 9/2023 | Wadhwa | H03L 7/0818 327/158 |
| 2017/0077945 | A1 * | 3/2017 | Pagnanelli | H03F 3/45475 |
| 2020/0259499 | A1 * | 8/2020 | White | H03M 1/0626 |
| 2021/0167786 | A1 * | 6/2021 | Nagatani | H03M 1/0624 |
| 2022/0254394 | A1 * | 8/2022 | Shalmani | G11C 7/222 |
| 2022/0416804 | A1 * | 12/2022 | Mehdizad Taleie | H03M 1/466 |
| 2022/0416805 | A1 * | 12/2022 | An | H03M 1/785 |
| 2025/0219647 | A1 * | 7/2025 | Kalani | H03M 1/0653 |

* cited by examiner

*Primary Examiner* — Lam T Mai
(74) *Attorney, Agent, or Firm* — Smith Tempel Blaha LLC/Qualcomm

(57) ABSTRACT

An active phase shifter includes a gain control signal generator circuit having a constant transconductance (Gm) bias circuit and a bias digital-to-analog converter (DAC), and a vector modulator configured to receive bias outputs of the gain control signal generator circuit.

20 Claims, 9 Drawing Sheets

BIAS CIRCUIT FOR AN ACTIVE PHASE SHIFTER

FIELD

The present disclosure relates generally to electronics, and more specifically to phase shifters in transceivers.

BACKGROUND

Wireless communication devices and technologies are becoming ever more prevalent, as are communication devices that operate at millimeter-wave (mmW) and sub-terahertz (subTHz) frequencies. Wireless communication devices generally transmit and/or receive communication signals. In a radio frequency (RF) transceiver, a communication signal is typically amplified and transmitted by a transmit section and a received communication signal is amplified and processed by a receive section. A transceiver for communication in 5G and 6G applications generally communicates using sub-7 GHz frequency signals, upper mid band frequency signals from approximately 7 GHz to approximately 24 GHz, millimeter wave (mmW) frequency signals above 24 GHz and sub-THz frequencies generally understood to refer to signals at frequencies above 100 GHz.

A band referred to as FR2 may use mmW frequencies of approximately 24 GHz or higher. FR2 band transceivers used in 5G communication systems generally use what is referred to as beamforming (or phased-array beamforming) to increase system capacity and maintain link budget requirements. Beamforming generally uses individual transmit and receive elements where a phase shifter alters the phase of the signal. Typically, many such elements and phase shifters are implemented in such a system.

A phase shifter may be realized using active devices or passive devices. An active phase shifter may be implemented as an I/Q (in phase/quadrature) vector modulator, which is compact, provides gain, has a high phase resolution and is calibration-ready. As used herein, the term "calibration-ready" generally means that the phase shifter circuits are amenable to straightforward calibration procedures to fine tune or trim the phase shifts implemented by the phase shifter. In such a phase shifter, the phase resolution and accuracy is influenced by the gain control accuracy of the I and Q path variable gain amplifiers (VGAs) in an I/Q vector modulator. Therefore, it is desirable that a bias circuit for the VGAs allow the VGAs to provide high phase resolution and low phase/gain error.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an active phase shifter including a gain control signal generator circuit having a constant transconductance (Gm) bias circuit and a bias digital-to-analog converter (DAC), and a vector modulator configured to receive bias outputs of the gain control signal generator circuit.

Another aspect of the disclosure provides a method for biasing a phase shifter including generating a set of references that mimic operation of devices sought to be controlled in a vector modulator, and using the set of references to generate control signals to control the vector modulator.

Another aspect of the disclosure provides a device including means for generating a set of references that mimic operation of devices sought to be controlled in a vector modulator, and means for using the set of references to generate control signals to control the vector modulator.

BRIEF DESCRIPTION OF THE DRAWINGS

In the figures, like reference numerals refer to like parts throughout the various views unless otherwise indicated. For reference numerals with letter character designations such as "102*a*" or "102*b*", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In an exemplary embodiment, a bias circuit for a phase shifter may include a constant transconductance (Gm) bias circuit and a bias digital-to-analog converter (DAC). In an exemplary embodiment, the bias DAC can be a non-linear bias DAC or a linear bias DAC.

In an exemplary embodiment, the constant Gm bias circuit may provide a process, voltage, temperature (PVT) robust bias reference signal matched to the variable gain amplifier (VGA) device being controlled.

In an exemplary embodiment, the bias DAC may be implemented using an equal or a nonequal value resistor string. Depending on operating frequency a nonequal value resistor string (having symmetrical nonequal resistance values ranging from $[R_{2^{N-1}-2}, \ldots, R_0]$) for example, may compensate for residual non-linearities in the gain control characteristic of the VGA in the phase shifter.

Figure 1:
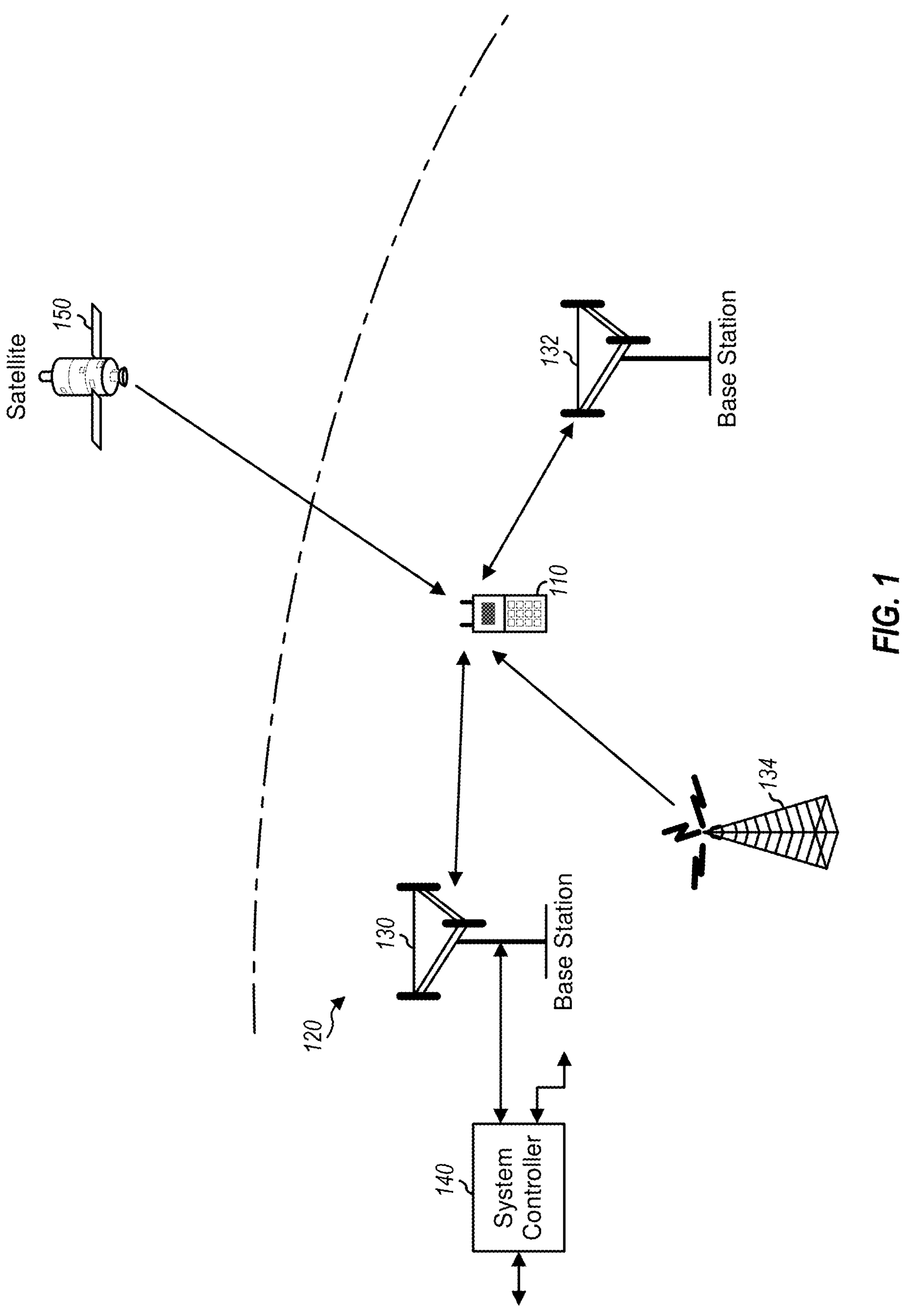
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless communication system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, an automobile, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134) and/or signals from satellites (e.g., a satellite 150 in one or more global navigation satellite systems (GNSS)), etc.). Wireless device 110 may support one or more radio technologies for wireless communication such as LTE, WCDMA, CDMA 1×, EVDO, TD-SCDMA, GSM, 802.11, 802.15, 5G, Sub6 5G, 6G, UWB, etc.

Wireless device 110 may be able to operate in a variety of communication bands including, for example, those communication bands used by LTE, WiFi, 5G or other communication bands, over a wide range of frequencies. Wireless device 110 may also be capable of communicating directly with other wireless devices without communicating through a network.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2A:
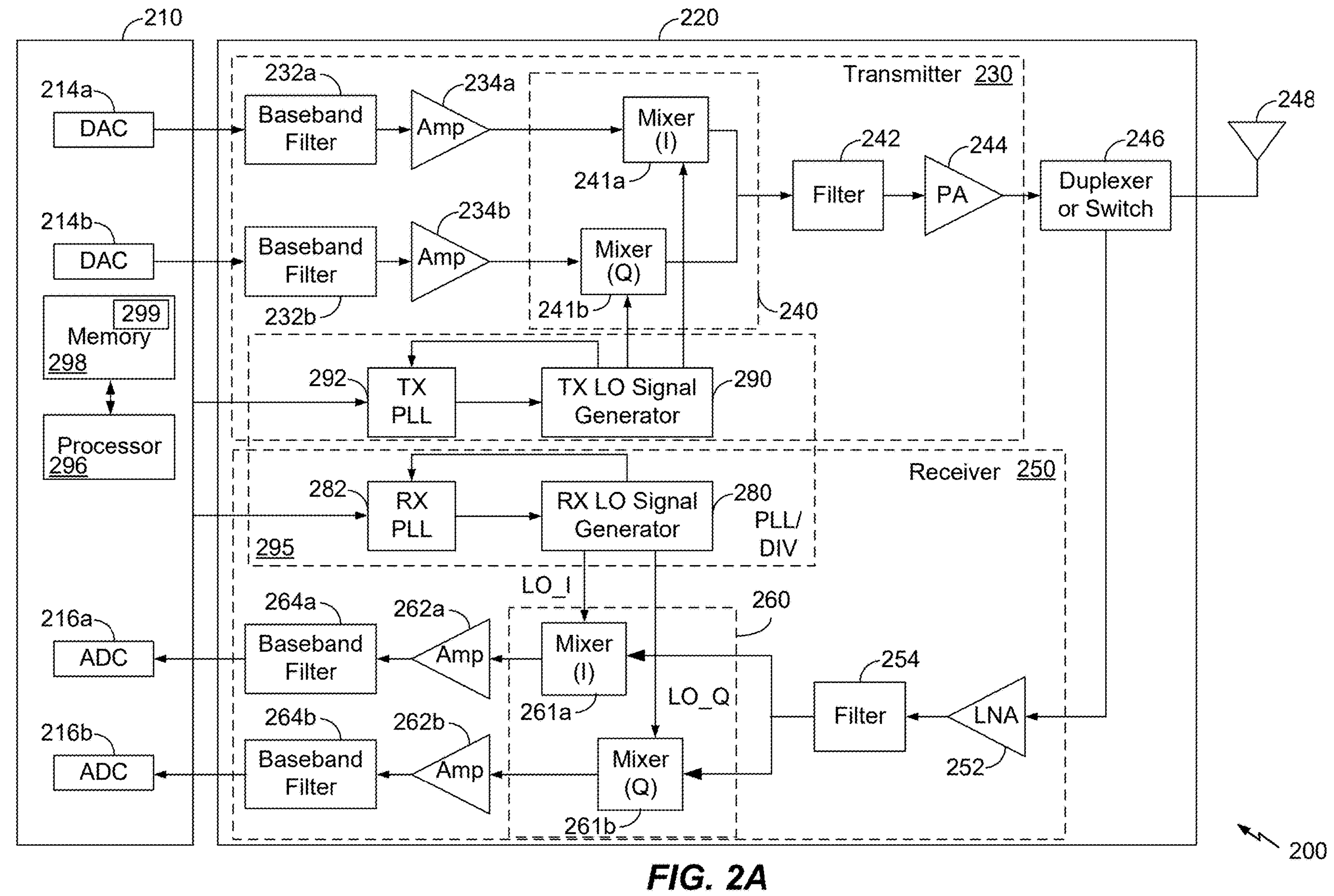
FIG. 2A is a block diagram showing a wireless device in which exemplary techniques of the present disclosure may be implemented.

FIG. 2A is a block diagram showing a wireless device 200 in which the exemplary techniques of the present disclosure may be implemented. The wireless device 200 may, for example, be an embodiment of the wireless device 110 illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250, for example phase shifters as discussed further below. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes shown generally using reference numeral 299. The data processor 210 and portions of the memory 298 may generally comprise analog and/or digital processing and storage components. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2A, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214*a* and 214*b* for converting digital signals generated by the data processor 210 into the I and Q analog output signals, e.g., I and Q output currents, for further processing. In other embodiments, the DACs 214*a* and 214*b* are included in the transceiver 220 and the data processor 210 provides data (e.g., for I and Q) to the transceiver 220 digitally.

Within the transmitter 230, lowpass filters 232*a* and 232*b* filter the I and Q analog transmit signals, respectively, to remove undesired images caused by the prior digital-to-analog conversion. Amplifiers (Amp) 234*a* and 234*b* amplify the signals from lowpass filters 232*a* and 232*b*, respectively, and provide I and Q baseband signals. An upconverter 240 having upconversion mixers 241*a* and 241*b* upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 246 and transmitted via an antenna 248, or alternatively it can be sent to a separate transmit antenna different from a separate receive antenna. While examples discussed herein utilize I and Q signals, those of skill in the art will understand that components of the transceiver may be configured to utilize polar modulation.

In the receive path, antenna 248 receives communication signals and provides a received RF signal, which can be routed through duplexer or switch 246 and provided to a low noise amplifier (LNA) 252. The duplexer 246 is designed to operate with a specific RX-to-TX duplexer frequency separation, such that RX signals are isolated from TX signals. Alternatively, there may be a separate transmit antenna and separate receive antenna as mentioned above, in which case RX-to-TX isolation can be achieved through the limited coupling between the two antennas. In the case of separate RX and TX antennas, the RX antenna can be coupled directly to LNA 252. The received RF signal is amplified by LNA 252 and filtered by a filter 254 to obtain a desired RF input signal. Downconversion mixers 261*a* and 261*b* in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262*a* and 262*b* and further filtered by lowpass filters 264*a* and 264*b* to obtain I and Q analog input signals, which are provided to data processor 210. In the exemplary embodiment shown, the data processor 210 includes analog-to-digital-converters (ADC's) 216*a* and 216*b* for converting the analog input signals into digital signals to be further processed by the data processor 210. In some embodiments, the ADCs 216*a* and 216*b* are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

In an exemplary embodiment, the RX PLL 282, the TX PLL 292, the RX LO signal generator 280, and the TX LO signal generator 290 may alternatively be combined into a single LO generator circuit 295, which may include common or shared LO signal generator circuitry to provide the TX LO signals and the RX LO signals. Alternatively, separate LO generator circuits may be used to generate the TX LO signals and the RX LO signals.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

In an exemplary embodiment in a super-heterodyne architecture, the filter 242, PA 244, LNA 252 and filter 254 may be implemented separately from other components in the transmitter 230 and receiver 250, and may be implemented on a millimeter wave integrated circuit. An example super-heterodyne architecture is illustrated in FIG. 2B.

Figure 2B:
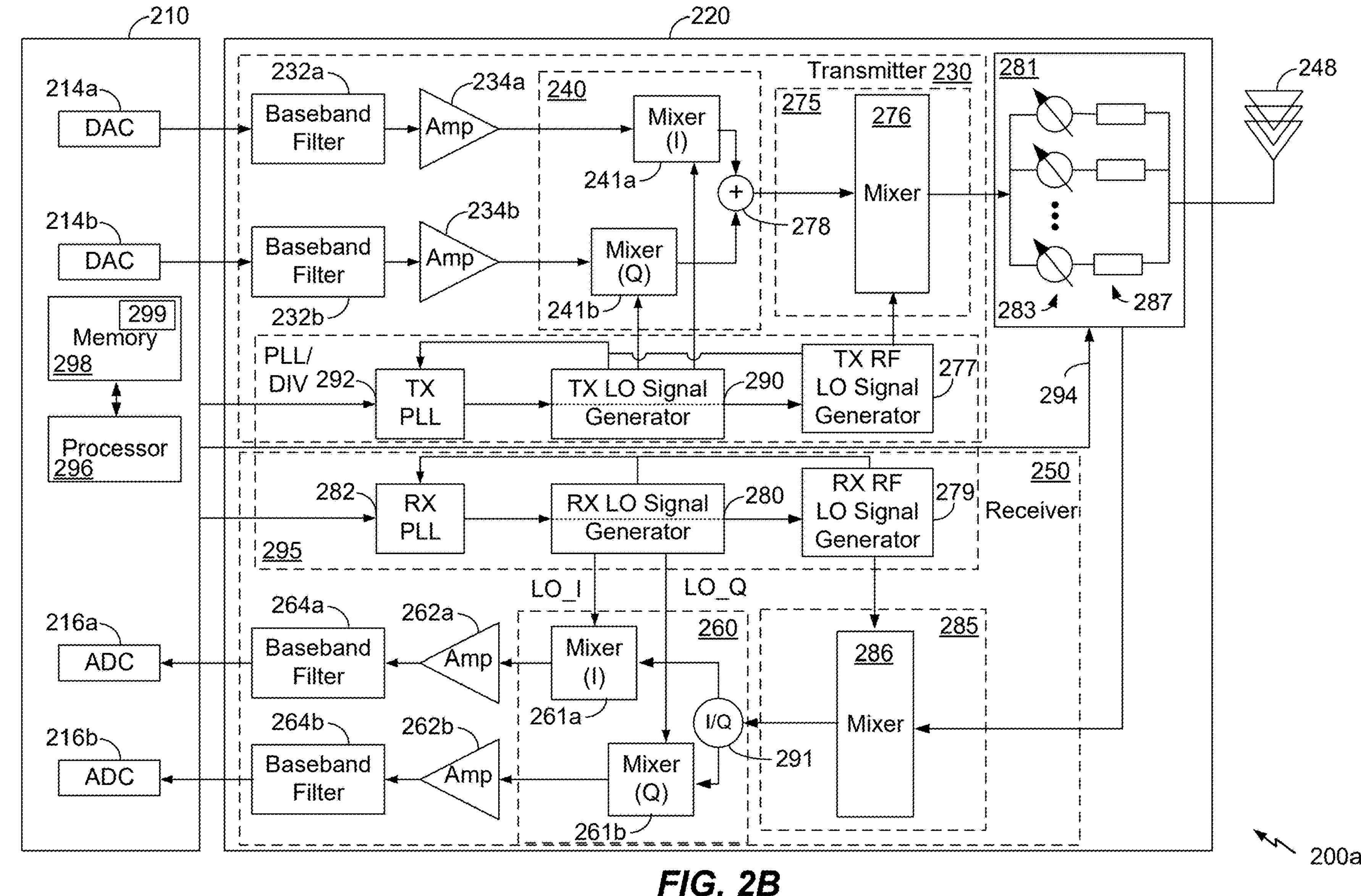
FIG. 2B is a block diagram showing a wireless device in which exemplary techniques of the present disclosure may be implemented.

FIG. 2B is a block diagram showing a wireless device in which the exemplary techniques of the present disclosure may be implemented. Certain components, for example which may be indicated by identical reference numerals, of the wireless device 200*a* in FIG. 2B may be configured similarly to those in the wireless device 200 shown in FIG. 2A and the description of identically numbered items in FIG. 2B will not be repeated.

The wireless device 200*a* is an example of a heterodyne (or superheterodyne) architecture in which the upconverter 240 and the downconverter 260 are configured to process a communication signal between baseband and an intermediate frequency (IF). For example, the upconverter 240 may be configured to provide an IF signal to an upconverter 275. In an exemplary embodiment, the upconverter 275 may comprise upconversion mixer 276. The summing function 278 of upconverter 240 combines the I and the Q outputs and provides a combined signal to the mixer 276. The combined signal may be single ended or differential. The mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2B as being shared by the signal generators 290, 277, a respective PLL for each signal generator may be implemented.

In an exemplary embodiment, components in the phase shift circuitry 281 may comprise one or more adjustable or variable phased array elements, and may receive one or more control signals from the data processor 210 over connection 294 and operate the adjustable or variable phased array elements based on the received control signals.

In an exemplary embodiment, the phase shift circuitry 281 comprises phase shifters 283 and phased array elements 287. Although three phase shifters 283 and three phased array elements 287 are shown for ease of illustration, the phase shift circuitry 281 may comprise more or fewer phase shifters 283 and phased array elements 287.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, amplifiers, driver amplifiers, and power amplifiers. In some embodiments, the phase shifters 283 may be incorporated within respective phased array elements 287.

The output of the phase shift circuitry 281 is provided to an antenna array 248. In an exemplary embodiment, the antenna array 248 comprises a number of antennas that typically correspond to the number of phase shifters 283 and phased array elements 287, for example such that each antenna element is coupled to a respective phased array element 287. In an exemplary embodiment, the phase shift circuitry 281 and the antenna array 248 may be referred to as a phased array.

In a receive direction, an output of the phase shift circuitry 281 is provided to a downconverter 285. In an exemplary embodiment, the downconverter 285 may comprise a downconversion mixer 286. In an exemplary embodiment, the mixer 286 downconverts the receive RF signal provided by the phase shift circuitry 281 to an IF signal according to RX RF LO signals provided by an RX RF LO signal generator 279. The I/Q generation function 291 of downconverter 260 receives the non-quadrature IF signal from the mixer 286 and generates I and Q signals in downconverter 260, which downconverts the IF signals to baseband, as described above. Typically the I/Q generation function 291 is an IF signal splitter and the quadrature baseband signals are created by the multiplication of RX LO_I with the I branch of the IF signal from the I/Q generation function 291 and RX LO_Q with the Q branch of the IF signal from the I/Q generation function 291. While PLL 282 is illustrated in FIG. 2B as being shared by the signal generators 280, 279, a respective PLL for each signal generator may be implemented.

In some embodiments, the upconverter 275, downconverter 285, and the phase shift circuitry 281 are implemented on a common IC. In some embodiments, the mixers 276, 286 and the phase shift circuitry 281 are implemented on the common IC, while the summing function 278 and mixers 241*a* and 241*b* and the I/Q generation function 291 and mixers 261*a* and 261*b* are implemented in another IC coupled to the IC having the mixers 276, 286. In some embodiments, the LO signal generators 277, 279 are included in the common IC. In some embodiments in which phase shift circuitry is implemented on a common IC with 276, 286, 277, and/or 279, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect. For example, components of the antenna array 248 may be implemented on a substrate and coupled to an integrated circuit implementing the phase shift circuitry 281 via a flexible printed circuit or the chip may be mounted on the substrate.

In some embodiments, both the architecture illustrated in FIG. 2A and the architecture illustrated in FIG. 2B are implemented in the same device. For example, a wireless device 110 or 200 may be configured to communicate with signals having a frequency below about 7 GHz (e.g., the FR1 frequency band) using the architecture illustrated in FIG. 2A and to communicate with signals having a frequency above about 24 GHz using the architecture illustrated in FIG. 2B. In devices in which both architectures are implemented, one or more components of FIGS. 2A and 2B that are identically numbered may be shared between the two architectures. For example, both signals that have been downconverted directly to baseband from RF and signals that have been downconverted from RF to baseband via an IF stage may be filtered by the same baseband filter 264. In other embodiments, a first version of the filter 264 is included in the portion of the device which implements the architecture of FIG. 2A and a second version of the filter 264 is included in the portion of the device which implements the architecture of FIG. 2B.

Figure 2C:
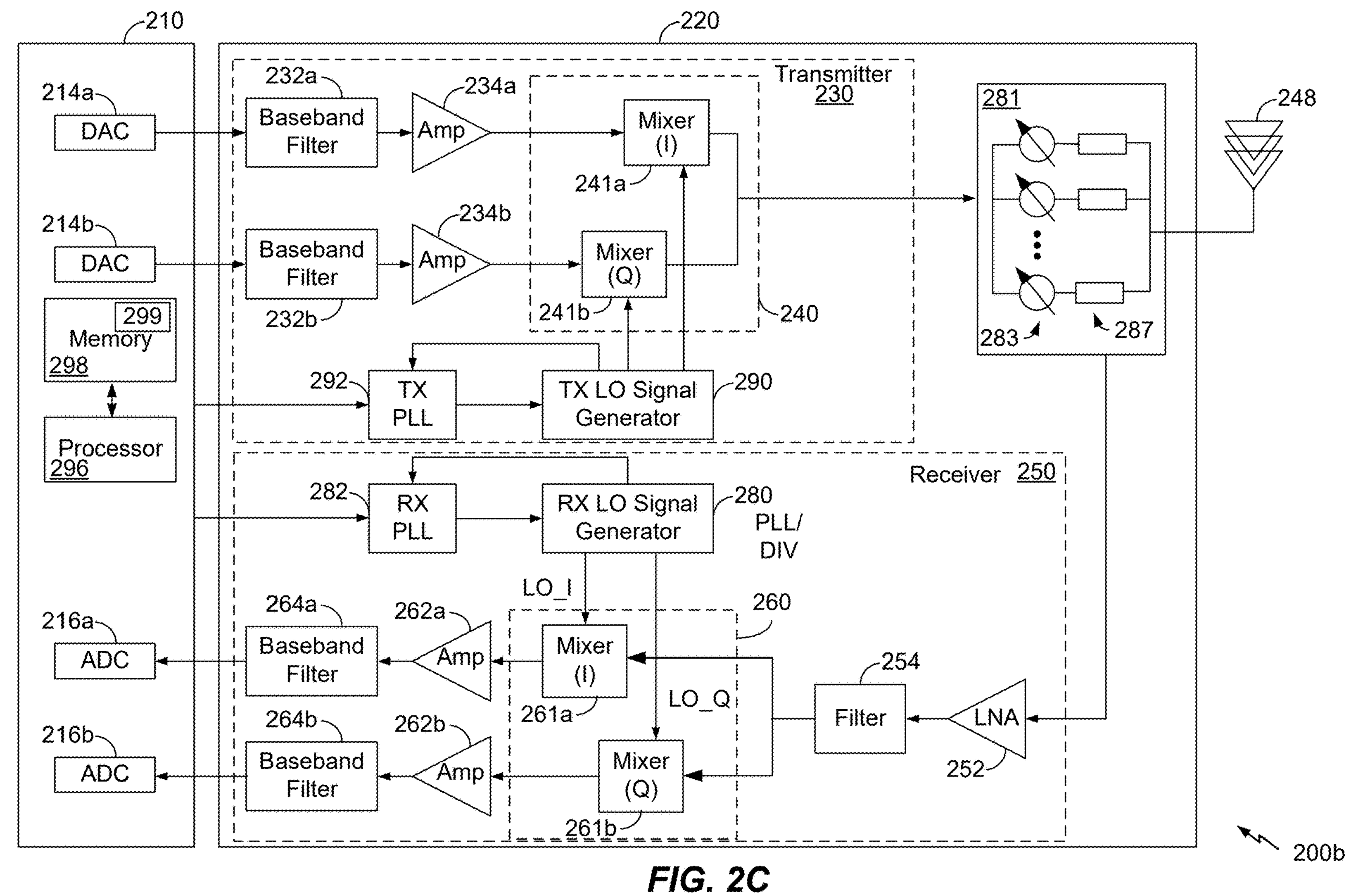
FIG. 2C is a block diagram showing a wireless device in which exemplary techniques of the present disclosure may be implemented.

FIG. 2C is a block diagram showing a wireless device in which exemplary techniques of the present disclosure may be implemented. Certain components, for example which may be indicated by identical reference numerals, of the wireless device 200*b* in FIG. 2C may be configured similarly to those in the wireless device 200 shown in FIG. 2A and/or the wireless device 200*a* shown in FIG. 2B and the description of identically numbered items in FIG. 2C will not be repeated.

The wireless device 200*b* in FIG. 2C incorporates the phase shift circuitry 281 (of FIG. 2B) in a direct conversion architecture, where mm W transmission signals are upconverted and downconverted between baseband and RF without the use of intermediate frequency (IF) signal conversion. Such an architecture may be referred to as a low IF (LIF), or a zero IF (ZIF) architecture. For example, the LO signals in the architecture of FIG. 2C may comprise signals at frequencies of tens of GHz. In other examples, the LO signals may be a single digit or low double digit GHz frequency (for example, when the wireless device 200*b* is configured for use with signals in an FR3 band) or hundreds of GHz (for example, when the wireless device 200*b* is configured for use with signals in a sub-THz band).

In some embodiments, the upconverter 240, downconverter 260, and the phase shift circuitry 281 are implemented on a common IC. In some embodiments, the LO signal generators 280, 290 are included in the common IC. In some embodiments, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect or both are mounted to a substrate. For example, components of the antenna array 248 may be implemented on a substrate and coupled to an integrated circuit implementing the phase shift circuitry 281 via a flexible printed circuit or the integrated circuit may be mounted to an opposite side of the substrate. In some embodiments, multiple iterations of the upconverter 240 and downconverter 260 may be implemented to process multiple signals on different frequency bands.

Figure 3:
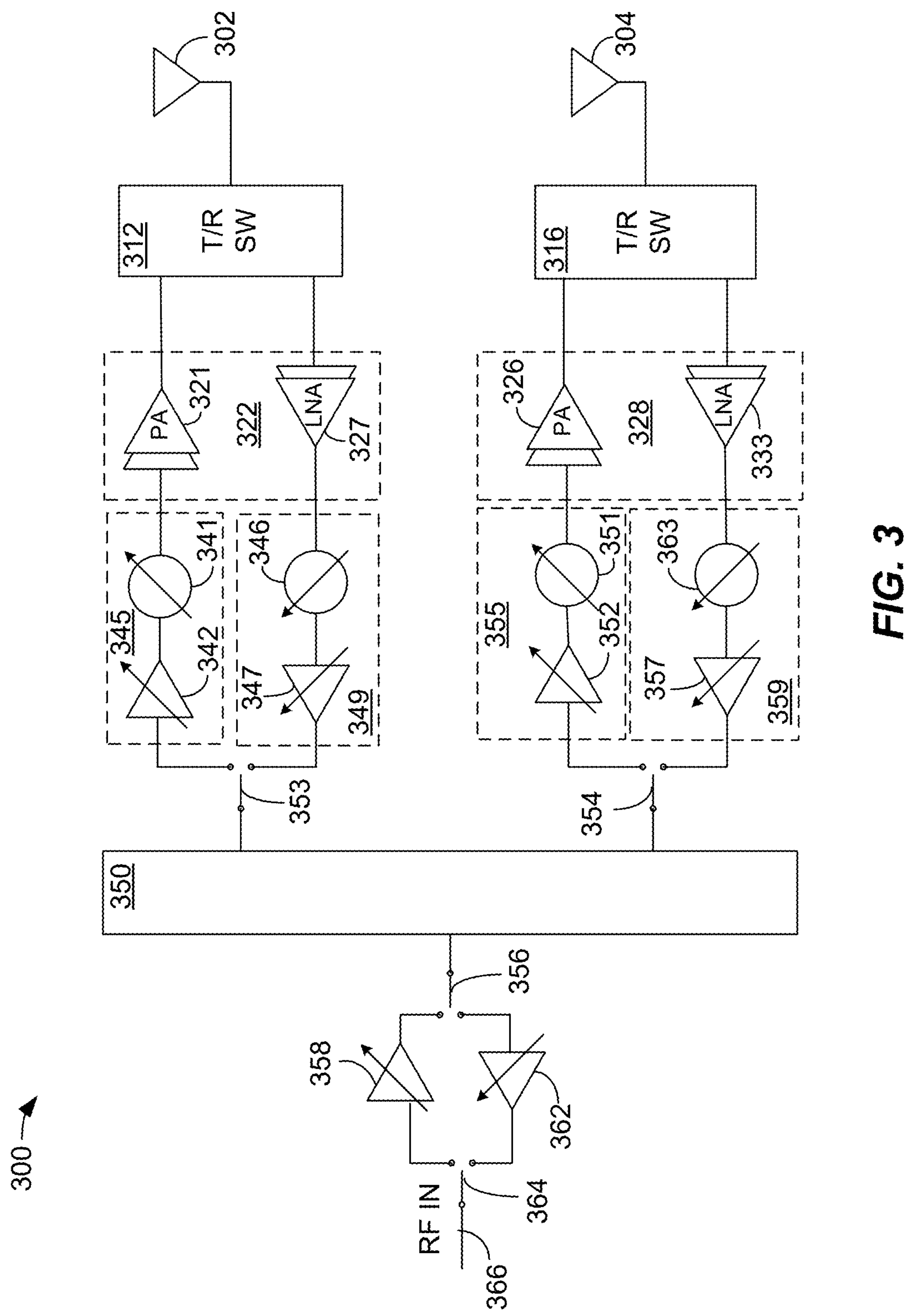
FIG. 3 is a diagram showing a portion of the circuitry on a millimeter wave integrated circuit (mmw-IC).

FIG. 3 is a diagram showing a circuitry 300 including a phase shifter that may be implemented on a millimeter wave integrated circuit (mmW-IC). In an exemplary embodiment, some or all of the circuitry 300 may be fully or partially implemented on a mmW-IC or on one or more mmW-ICs. In other examples, the antennas illustrated in FIG. 3 may be implemented in the same module as the mmW-IC (but separate from the mmW-IC), or the illustrated antennas may be remote from the mmW-IC.

In an exemplary embodiment, the circuitry 300 may include antennas 302 and 304. The antennas 302 and 304 may be part of the antenna array 248 of FIG. 2B or FIG. 2C, and may be configured to cover different frequency ranges. For example, the antenna 302 may be configured to operate in one band and the antenna 304 may be configured to operate on another frequency band. In some examples, the antenna 302 and the antenna 304 are configured to support the same frequency range, for example to support beamforming or other phased array functionality.

In an exemplary embodiment, the antenna 302 may be connected to a TX/RX (T/R) switch 312 and the antenna 304 may be connected to a TX/RX switch 316. The TX/RX switch 312 may be connected to a phased array element 322 and the TX/RX switch 316 may be connected to a phased array element 328. In an exemplary embodiment, the phased array element 322 and the phased array element 328 may be configured to operate on the same or different frequency bands.

In an exemplary embodiment, the phased array element 322 may comprise a power amplifier (PA) 321 and a low noise amplifier (LNA) 327. Although shown as a single element, the power amplifier 321 and the LNA 327 may each comprise more than one amplification stage.

In an exemplary embodiment, the phased array element 328 may comprise a power amplifier 326 and an LNA 333. Although shown as a single element, the power amplifier 326 and the LNA 333 may each comprise more than one amplification stage.

Although shown as part of the circuitry 300, in some embodiments, the phased array elements 322 and 328 may be located on a separate radio frequency (RF) module.

In an exemplary embodiment, the phased array element 322 may be connected to a gain and phase control module 345 and a gain and phase control module 349, and the phased array element 328 may be connected to a gain and phase control module 355 and a gain and phase control module 359.

In an exemplary embodiment, the gain and phase control module 345 may include a variable gain amplifier (VGA) 342 and a phase shifter 341. In an exemplary embodiment, the gain and phase control module 349 may include a variable gain amplifier (VGA) 347 and a phase shifter 346.

In an exemplary embodiment, the gain and phase control module 355 may include a variable gain amplifier (VGA) 352 and a phase shifter 351. In an exemplary embodiment, the gain and phase control module 359 may include a variable gain amplifier (VGA) 357 and a phase shifter 363.

In an exemplary embodiment, the VGA 342, VGA 347, VGA 352 and VGA 357 and the phase shifters 341, 346, 351 and 363 may be controlled by a control signal from the data processor 210 (FIG. 2B, 2C) or another controller.

The gain and phase control module 345 and the gain and phase control module 349 may be connected to a power combining and splitting network 350 through a switch 353; and the gain and phase control module 355 and the gain and phase control module 359 may be connected to the power combining and splitting network 350 through a switch 354. The switch 353 and the switch 354 may form a transmit/receive switch when the power combining/splitting network 350 is shared between transmit and receive modes as shown in FIG. 3. Alternatively, if a separate power splitting network is used for transmit mode and a separate power combining network is used for receive mode then the switch 353 and the switch 354 may be through connections from the gain and phase control modules 345 and 355 to a separate power splitting network and from the gain and phase control modules 349 and 359 to a separate power combining network.

The power combining and splitting network 350 may be connected to RF TX VGA 358 and RF RX VGA 362 through a switch 356. A transmit RF signal may be provided from connection 366 to the RF TX VGA 358; and the RF RX VGA 362 may provide a receive signal to the connection 366, depending on the position of the switches 356 and 364.

In an exemplary embodiment, the RF TX VGA 358 and the RF RX VGA 362 may be controlled by a control signal from the data processor 210 (FIG. 2B, 2C) or another controller. In an alternative embodiment with separate power combining and power splitting networks, switch 356 may be omitted and the RF TX VGA 358 may be connected to a common port of a separate power splitting network and the RF RX VGA 362 may be connected to a common port of a separate power combining network.

In an exemplary embodiment, the VGA 342 and the phase shifter 341; and the VGA 352 and the phase shifter 351 may be configured to operate on transmit signals; and the VGA 347 and the phase shifter 346; and the VGA 357 and the phase shifter 363 may be configured to operate on receive signals. In other examples, certain TX and RX elements may be combined into a bidirectional element.

As will be described below, an exemplary embodiment of a phase shifter may be implemented with active devices that may be implemented in the phase shifters 341, 346, 351 and 363.

Figure 4:
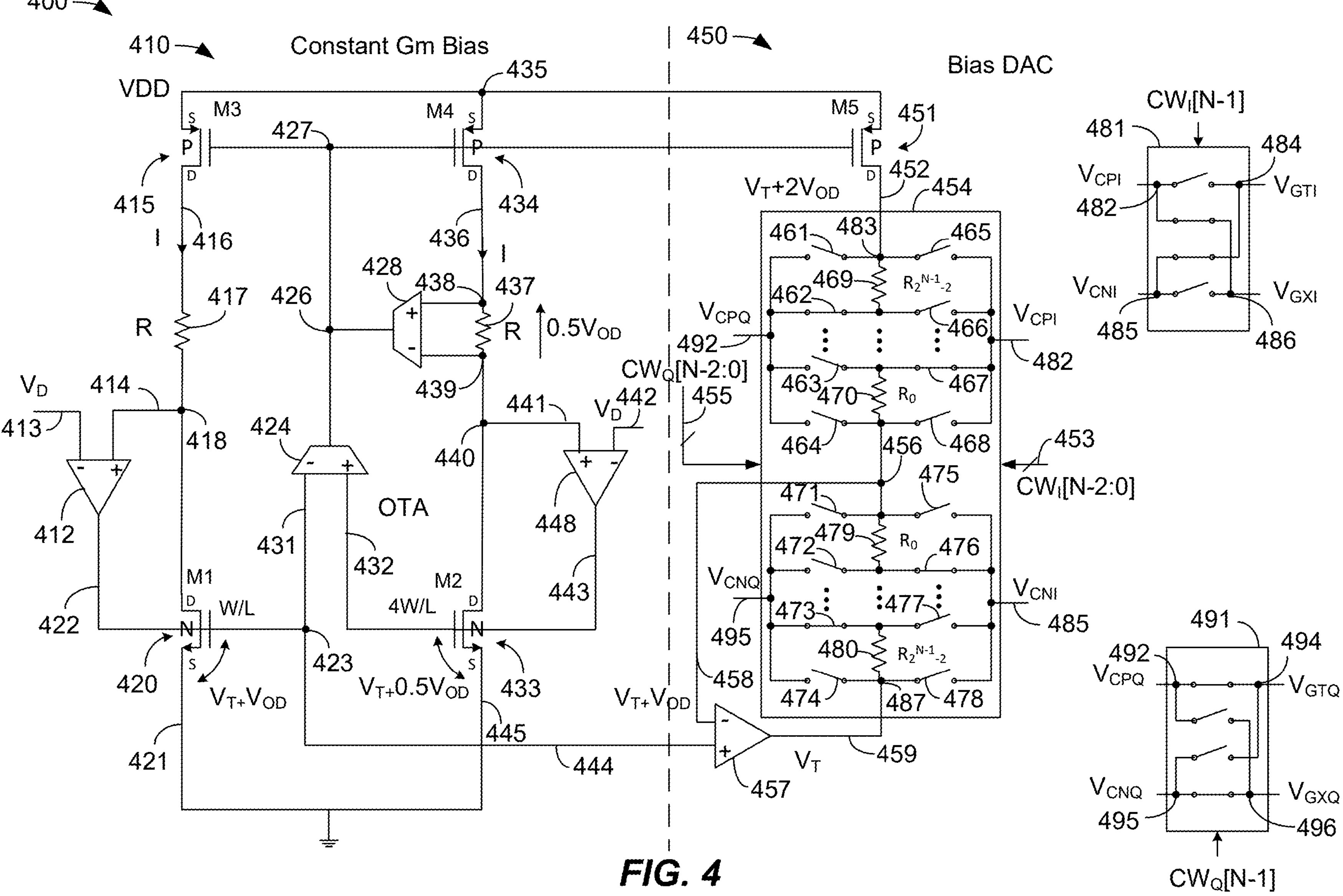
FIG. 4 is a schematic diagram of a bias circuit for a phase shifter of FIG. 3 in which exemplary techniques of the present disclosure may be implemented.

FIG. 4 is a schematic diagram of a bias circuit for a phase shifter of FIG. 3 in which exemplary techniques of the present disclosure may be implemented. In an exemplary embodiment, a gain control signal generator circuit 400 includes a constant transconductance (Gm) bias circuit 410 and a bias digital-to-analog converter (DAC) 450.

Prior to describing FIG. 4, definitions for the following voltages and signals are provided:

$V_T$—Threshold voltage of a transistor device the Gm (transconductance) of which is to be controlled/regulated.

$V_{OD}$—Over drive voltage ($V_{GS}-V_T$) of a transistor device the Gm (transconductance) of which is to be controlled/regulated where $V_{GS}$ is the gate-source bias voltage on the transistor device. This voltage determines the current and the Gm of the transistor device.

$V_D$—Drain voltage of the VGA transistor device the Gm of which is to be controlled/regulated.

$V_{CPQ}$—Q channel control voltage plus (above mid-point voltage $V_T+V_{OD}$) before cross switching.

$V_{CNQ}$—Q channel control voltage minus (below mid-point voltage $V_T+V_{OD}$) before cross switching.

$V_{CPI}$—I channel control voltage plus (above mid-point voltage $V_T+V_{OD}$) before cross switching.

$V_{CNI}$—I channel control voltage minus (below mid-point voltage $V_T+V_{OD}$) before cross switching.

$V_{GTI}$—I (In-phase) channel through amplifier gate bias voltage signal for through transistors (514 and 518 (FIG. 5)) in I VGA.

$V_{GXI}$—I (In-phase) channel cross amplifier gate bias voltage signal for cross transistors (516 and 517 (FIG. 5)) in I VGA.

$V_{GTQ}$—Q (Quadrature phase) channel through amplifier gate bias voltage signal for through transistors (534 and 538 (FIG. 5)) in Q VGA.

$V_{GTQ}$—Q (Quadrature phase) channel cross amplifier gate bias voltage signal for cross transistors (536 and 537 (FIG. 5)) in Q VGA.

$CW_I$—N-bit control word for I (In-phase) channel.

$CW_Q$—N-bit control word for Q (Quadrature phase) channel.

In an exemplary embodiment, the constant transconductance (Gm) bias circuit 410 may include an amplifier 412, an amplifier 448, an operational transconductance amplifier (OTA) 424, an OTA 428, transistors 420 and 433, and transistors 415 and 434.

In an exemplary embodiment, the transistors 415 and 434 may be P-type devices arranged in a common source configuration forming a matched current mirror. The transistors 420 and 433 may be N-type devices arranged in a common source configuration.

In an exemplary embodiment, a resistance 417 may be connected to the drain of the transistor 415 and a resistance 437 may be connected to the drain of the transistor 434. As used herein, the term "resistance" may refer to a resistor component or device, or may refer to another device that may provide an electrical resistance.

In an exemplary embodiment, the source of the transistor 415, the source of the transistor 434, and the source of the transistor 451 are connected to a system voltage, VDD, at a node 435.

The drain of the transistor 415 is connected to one side of the resistance 417 over connection 416. The other side of the resistance 417 is connected to a drain of the transistor 420. A node 418 is formed between the resistance 417 and the drain of the transistor 420. The node 418 provides an input to the non-inverting input of the amplifier 412. The amplifiers 412 and 448, and the connections 422 and 443 create a condition where the drain voltages of the transistor 420 and the transistor 433 are at $V_D$, which is the same as the drain voltages of the transistors 514, 516, 517, 518, 534, 536, 537 and 538 in FIG. 5. The connection 422 may connect the output of the amplifier 412 to the gate of the transistor 420 (e.g., to the node 423 and the inverting input of the OTA 424). The connection 443 may connect the output of the amplifier 448 to the gate of the transistor 433 (e.g., to the non-inverting input of the OTA 424).

The drain of the transistor 434 is connected to one side of the resistance 437 over connection 436. The other side of the resistance 437 is connected to the drain of the transistor 433. A node 440 is formed between the resistance 437 and the drain of the transistor 433. The node 440 provides an input to the non-inverting input of the amplifier 448.

In an exemplary embodiment, the output of OTA 428 is connected to the gates of the transistors 415, 434 and 451 at a node 426 and a node 427. The inputs of the OTA 428 are connected across the resistance 437 at nodes 438 and 439.

In an exemplary embodiment, the OTA 424 is connected to the node 426 and also to a node 423 and to the gate of the transistor 433 at connection 432.

The amplifier 448 includes an inverting input connected to a supply voltage, VD, on connection 442 and includes a non-inverting input connected to the node 440 over connection 441. The supply voltage, VD, on connection 442 is set to equal the drain voltage of the transistor devices that are in the VGA (I VGA 510 and Q VGA 530 in FIG. 5 to be described below) that the gain control signal generator circuit 400 is controlling. The voltage VD is a supply voltage that is provided to the I VGA 510 and Q VGA 530 in FIG. 5 by, for example, a power management integrated circuit (PMIC) (not shown).

In an exemplary embodiment, the amplifier 412 has an inverting input connected to the supply voltage, $V_D$, over connection 413 and includes a non-inverting input connected over a connection 414 to the node 418 between the resistance 417 and the drain of the transistor 420. The supply voltage, $V_D$, on connection 413 is set to equal the drain voltage of the transistor devices that are in the VGA (I VGA 510 and Q VGA 530 in FIG. 5 to be described below) that the gain control signal generator circuit 400 is controlling.

A gate of the transistor 420 is connected to the node 423, which is also connected to the inverting input of the OTA 424 and to the non-inverting input of the amplifier 457.

Figure 5:
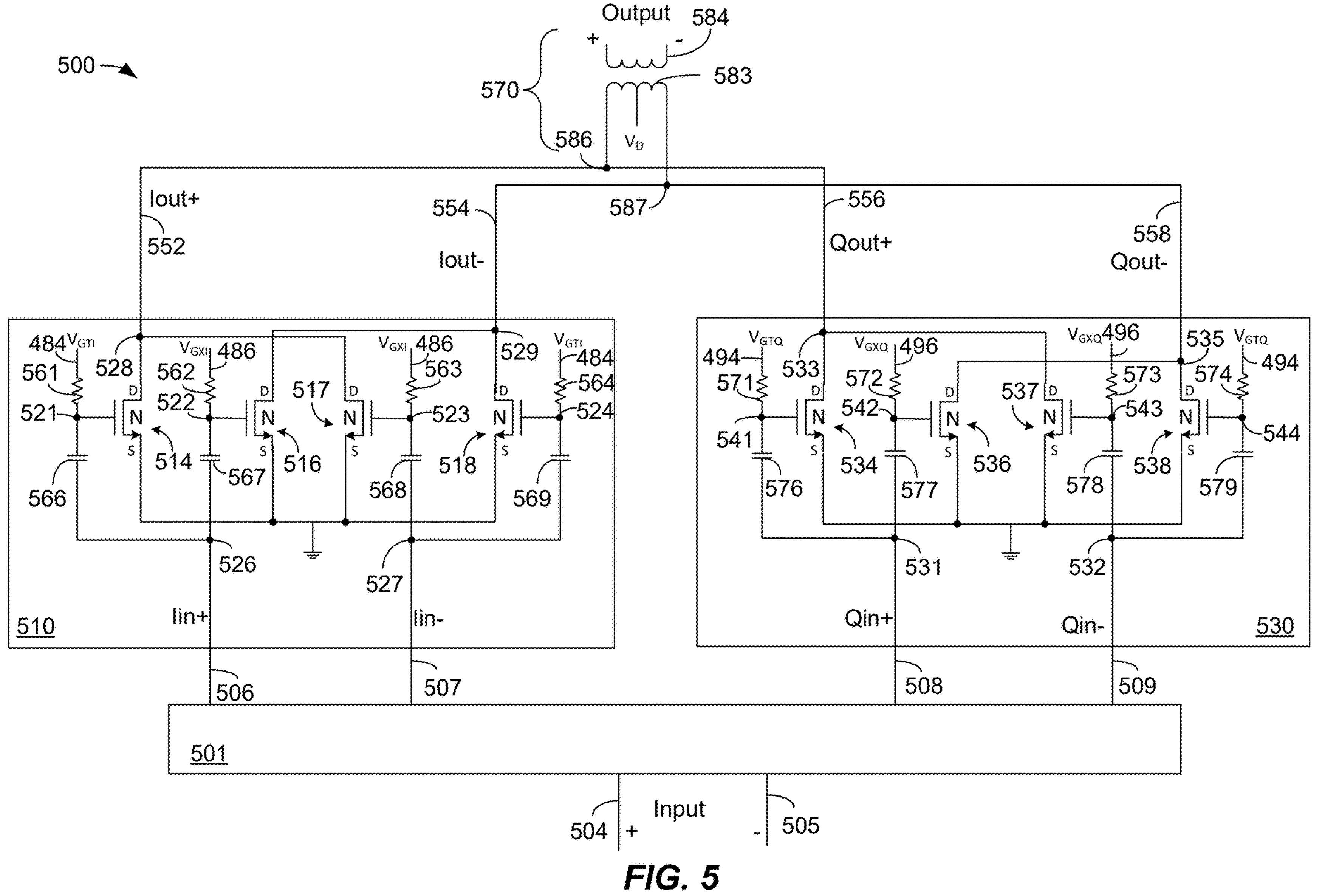
FIG. 5 is a schematic diagram of a phase shifter in which exemplary techniques of the present disclosure may be implemented.

In an exemplary embodiment, the constant transconductance (Gm) bias circuit 410 provides a process, voltage, temperature (PVT) robust bias reference on connection 444 matched to the VGA transistor devices in the I VGA 510 and Q VGA 530 of FIG. 5 being controlled.

In an exemplary embodiment, the constant transconductance (Gm) bias circuit 410 also provides a process, voltage, temperature (PVT) robust reference current as the drain current on transistor device 451 through the current mirror formed by transistor devices 415, 434 and 451.

In an exemplary embodiment, the bias DAC 450 may include the transistor 451, an amplifier 457, a resistor bank 454, a cross switch circuit 481 and a cross switch circuit 491.

In an exemplary embodiment, the resistor bank 454 may include resistances 469, 470, and may include switches 461, 462, 463, 464, 465, 466, 467 and 468.

In an exemplary embodiment, the number of resistances and switches between the node 452 and the node 456 is $2^{N-1}-1$ and $2^{N-1}$ respectively where N is the number of bits in the control words $CW_I$ and $CW_Q$, such that the number of switches is one (1) greater than the number of resistors from node 452 to node 456. The node 456 may also be referred to as a center node between the node 483 and the node 487. The control words $CW_I$ and $CW_Q$ are N bits. The most significant bit (MSB) of both control words are used to determine the quadrant in the phase plane. The remaining N−1 bits determine the available voltages from the resistor strings in the resistor bank 454. With N−1 bits, there are $2^{N-1}$ different voltages and this determines the number of switches. To generate these voltages, the number of resistors in the resistor strings are $2^{N-1}-1$ because of the end point voltages at the nodes 483 and 487.

In an exemplary embodiment, the resistor bank 454 may include resistances 479, 480 and may include switches 471, 472, 473, 474, 475, 476, 477 and 478.

In an exemplary embodiment, the number of resistances and switches between the node 456 and the node 487 is $2^{N-1}-1$ and $2^{N-1}$ respectively where N is the number of bits in the control words $CW_I$ and $CW_Q$ such that the number of switches is one (1) greater than the number of resistors from node 456 to node 487.

In an exemplary embodiment, the resistance values are symmetrical with respect to node 456. For example, the resistance 469 is equal in value to the resistance 480; and the resistance 470 is equal in value to the resistance 479.

In an exemplary embodiment, the cross switch circuit 481 may include switching circuitry configured to receive input voltages, $V_{CPI}$ at a node 482 and $V_{CNI}$ at a node 485 and to provide output voltages $V_{GTI}$ at a node 484, and $V_{GXI}$ at a node 486. The cross switch circuit 481 may also receive a digital control word, $CW_I[N-1]$ from the data processor 210 or another controller. In an exemplary embodiment, based on the state of the control word $CW_I[N-1]$, the cross switch 481 will determine if a direct or cross connection is to be made between its inputs ($V_{CPI}/V_{CNI}$) and outputs ($V_{GTI}/V_{GXI}$). This has the effect of multiplying the gain magnitude by +1 or −1 of the I channel VGA (510 in FIG. 5). The determination of whether the cross switch 481 provides a direct or cross connection influences the outputs of the I VGA 510 of FIG. 5.

In an exemplary embodiment, the cross switch circuit 491 may include switching circuitry configured to receive input voltages, $V_{CPQ}$ at a node 492 and $V_{CNQ}$ at a node 495 and to provide output voltages $V_{GTQ}$ at a node 494 and $V_{GXQ}$ at a node 496. The cross switch circuit 491 may also receive a digital control word, $CW_Q[N-1]$ from the data processor 210 or another controller. In an exemplary embodiment, based on the state of the control word $CW_Q[N-1]$, the cross switch 491 will determine if a direct or cross connection is to be made between its inputs ($V_{CPQ}/V_{CNQ}$) and outputs ($V_{GTQ}/V_{GXQ}$). This has the effect of multiplying the gain magnitude by +1 or −1 of the Q channel VGA (530 in FIG. 5). The determination of whether the cross switch 491 provides a direct or cross connection influences the outputs of the Q VGA 530 of FIG. 5.

In an exemplary embodiment, the voltages $V_{GTI}$ at node 484, $V_{GXI}$ at node 486, $V_{GTQ}$ at node 494 and $V_{GXQ}$ at node 496 determine the respective gain of the through and cross transistors in the I VGA 510 and Q VGA 530 (FIG. 5), and thus influence the sign and amplitude of the outputs of the I VGA 510 and Q VGA 530.

In an exemplary embodiment, one side of the switches 461, 462, 463 and 464 provides the voltage $V_{CPQ}$ at the node 492 and one side of the switches 465, 466, 467 and 468 provides the voltage $V_{CPI}$ at node 482. The other side of the switches 461, 462, 465 and 466 is connected to the resistance 469 and the other sides of the switches 463, 464, 467 and 468 is connected to the resistance 470.

In an exemplary embodiment, one side of the switches 471, 472, 473 and 474 provides the voltage $V_{CNQ}$ at node 495 and one side of the switches 475, 476, 477 and 478 provides the voltage $V_{CNI}$ at the node 485. The other side of the switches 471, 472, 475 and 476 is connected to the resistance 479 and the other side of the switches 473, 474, 477 and 478 is connected to the resistance 480.

In an exemplary embodiment, the resistor bank 454 may be connected to the drain of the transistor 451 at a node 483 and may be connected to an output of the amplifier 457 at a node 487. In an exemplary embodiment, an inverting input of the amplifier 457 is connected over connection 458 to the node 456 and the non-inverting input of the amplifier 457 is connected to connection 444. In an exemplary embodiment, the signal on connection 444 is a reference signal applied to the amplifier 457 of the bias DAC 450. The resistor bank 454 together with the amplifier 457 generate a set of references having voltage values between $V_T$ and $V_T+2V_{OD}$ with the input reference voltage on connection 444 and an input reference current from the transistor 451. The resistor string values in resistor bank 454 are dimensioned such that the ratio of the sum of resistance values $R_0$ (resistances 470 and 479 symmetrical with respect to node 456) to $R_{2^{N-1}-2}$ (resistances 469 and 480 symmetrical with respect to node 456) to the resistance of resistor 437 should be two times the size ratio of the transistor 434 to the transistor 451. With this set of voltages, the values of the voltages $V_{CPI}$, $V_{CNI}$, $V_{CPQ}$ and $V_{CNQ}$ are determined by controlling which four switches out of the switches (461, 462, 463, 464, 465, 466, 467, 468, 471, 472, 473, 474, 475, 476, 477 and 478) are conductive, which is determined by the control words $CW_I[N-2:0]$ and $CW_Q[N-2:0]$ provided by the data processor 210 or another controller. In an exemplary embodiment, the switches that are conductive on a channel (I/Q) are constrained to be symmetrical with respect to node 456. For example, switches 462 and 473 are controlled to be conductive together to generate voltages $V_{CPQ}$ and $V_{CNQ}$ for the Q channel as shown in FIG. 4. Similarly, switches 467 and 476 are controlled to be conductive together to generate voltages $V_{CPI}$ and $V_{CNI}$ for the I channel as shown in FIG. 4.

The digital control word, $CW_Q[N-2:0]$ is provided to the resistor bank 454 over connection 455 and the digital control word, $CW_I[N-2:0]$ is provided to the resistor bank 454 over connection 453. In an exemplary embodiment, the digital control word, $CW_Q[N-2:0]$ and the digital control word, $CW_I[N-2:0]$ may each comprise N−1 bits. The digital control word, $CW_Q[N-2:0]$ and the digital control word, $CW_I[N-2:0]$ may be provided by the data processor 210 of FIG. 2A, 2B, 2C, or by another controller. In other embodiments, the digital control word may have more or fewer bits.

In an exemplary embodiment, the control words $CW_I[N-2,0]$ and $CW_Q[N-2,0]$ determine the values of the voltages $V_{CPI}$, $V_{CNI}$, $V_{CPQ}$ and $V_{CNQ}$, and hence the gain magnitude of the I and Q channel VGAs (510/530 of FIG. 5), respectively.

The control words $CW_I[N-2:0]$ and $CW_Q[N-2:0]$ determine the gain magnitude of the I and Q channel VGAs respectively. This selects one out of a total of 4^(N−1) constellation points in the selected quadrant in the complex plane. The total number of constellation points comprises (2^(N−1) for each control word $CW_I[N-2:0]$ and $CW_Q[N-2:0]$ resulting in a total of 4^(N−1) constellation points. The larger the number of bits N, the greater the number of selectable constellation points and the higher the resolution. The most significant bit (MSB) of $CW_I$ and $CW_Q$, $CW_I[N-1]$ and $CW_Q[N-1]$, together determine which one of four (4) quadrants in the complex plane is selected by controlling the sign of the I and Q VGA gain. The constellation points lying on the I or Q axis are selectable by more than one $CW_I$ and $CW_Q$ combination in this exemplary implementation.

In an exemplary embodiment, the voltage on connection 444 between the gate and source of the transistor 420 is $V_T+V_{OD}$ and the voltage on connection 432 between the gate and source of the transistor 433 is $V_T+0.5V_{OD}$ due to the loop action of the constant transconductance (Gm) bias circuit 410, which causes a DC equilibrium. For example, the current flowing on connections 416 and 436 must be equal because transistors 415 and 434 are the same size. For the same drain current on transistors 420 and 433, the over drive voltage $V_{OD}=(V_{GS}-V_T)$ on transistor 433 will be half of that of transistor 420 because of the size ratio of four between the transistors 433 and 420. This means that in this example the voltage across connections 431 and 432 are equal to $0.5V_{OD}$. The loop action of the constant transconductance (Gm) bias circuit 410 is such that the combined net output current from the OTA 428 and the OTA 424 is zero. Because the OTA 428 and the OTA 424 have substantially identical transconductance, the voltage across the resistance 437 will also be $0.5V_{OD}$ in DC equilibrium. Since $Gm=I/(0.5V_{OD})$ for square law devices, the transconductance (Gm) of the transistor 420, biased with $I_D=I$ and $V_{GS}=V_T+V_{OD}=1/R$ which can be made robust to PVT variations by using accurate off-chip resistor or tuning a temperature insensitive on-chip resistor. The voltage $V_T+V_{OD}$ is the $V_{GS}$ for the mid point voltage at the node 456. This voltage is regulated by the constant transconductance (Gm) bias circuit 410 and represents the $V_{GS}$ that will be applied to each transistor 514, 516, 517, 518, 534, 536, 537 and 538 in FIG. 5 when the control word $CW_I[N-2:0]/CW_Q[N-2:0]$ is 0 and provides a gain of zero (0) for the I VGA 510 and the Q VGA 530 being controlled. The $V_{GS}$ of the transistors 514, 516, 517, 518, 534, 536, 537 and 538 amplifying devices is dependent on the phase settings of the active phase shifter. With the R of the resistance 437 being invariant to PVT variation, the constant transconductance (Gm) bias circuit 410 will adjust I and $V_{OD}$ in a way that the transconductance (Gm) is also invariant to PVT variations. In an exemplary embodiment the transistor 433 may be four (4) times the size of the transistor 420. However, in other embodiments, the size ratio between the transistor 433 and the transistor 420 may be any positive integer n. For example, the term "0.5" in $V_T+0.5V_{OD}$ may be replaced by 1/sqrt(n), where "n" refers to the relative size of the transistors 433 and 420. For example, $V_T$+0.5$V_{OD}$ may instead be $V_T$+$V_{OD}$/sqrt(n); likewise 0.5$V_{OD}$ on resistor 437 may instead be $V_{OD}$/sqrt(n) such that the ratio of the sum of resistance values $R_0$ to $R_{2^{N-1}-2}$ to the resistance of the resistor 437 should be sqrt(n) times the size ratio of transistor 434 to the transistor 451. In this example, the transistor 433 being four (4) times the size of the transistor 420 is chosen for convenience in this exemplary embodiment.

In an exemplary embodiment, the transistors 420 and 433 are operated under the same conditions and are operated the same as the circuit (the I VGA 510 and the Q VGA 530 in FIG. 5) sought to be controlled, with $V_D$ used in the gain control signal generator circuit 400 matching the $V_D$ in the circuit to be controlled. For example, to generate the control voltages with the gain control signal generator circuit 400 the transistors 420 and 433 should be the same type (N-type in this example) as the transistors inside the I VGA 510 and Q VGA 530, and should be operated at the same current density. The gain determining characteristics also depends on the terminal voltages for deep sub-micron metal oxide semiconductor (MOS) transistors. Mismatch in these conditions between the scaled replica transistors 433/420 to those in the I VGA 510 and Q VGA 530 will degrade the gain control accuracy. For deep sub-micron MOS devices, drain voltage has a particularly large effect especially for silicon on insulator (SOI) devices. To at least partially compensate for this, the amplifier 412 and the amplifier 448 are implemented to ensure that the drain voltage on the transistors 420 and 433 remain at $V_D$, which is the same as the drain voltage on the transistors in the I VGA 510 and the Q VGA 530 in FIG. 5.

In an exemplary embodiment, the transistor 420 is a scaled replica of the transistors in the I VGA 510 (FIG. 5) and Q VGA 530 (FIG. 5). The gain of I VGA 510 and Q VGA 530 in FIG. 5 have scaled dependencies on ($V_{GTI}$−$V_{GXI}$) and ($V_{GTQ}$−$V_{GXQ}$) respectively as the transconductance (Gm) of the transistor 420 on $V_{OD}$ in the constant transconductance (Gm) bias circuit 410. In an exemplary embodiment, the bias DAC 450 generates ($V_{GTI}$−$V_{GXI}$) and ($V_{GTQ}$−$V_{GXQ}$) with full scale of 2$V_{OD}$ (voltage level at node 483—voltage level at node 487) centered around $V_T$+$V_{OD}$ (voltage level at node 456). Since $V_{OD}$ is regulated by constant transconductance (Gm) bias circuit 410, it also ensures PVT robustness of the gain of the I VGA 510 and Q VGA 530 in FIG. 5.

In an exemplary embodiment, the bias DAC 450 may be implemented as a non-linear bias DAC and may be implemented using a symmetrical nonequal value resistor string ([$R_{2^{N-1}-2}$, . . . , $R_0$]) between the node 456 and the node 483 and between the node 456 and the node 487 in the resistor bank 454 to compensate for residual non-linearities (Gm, ro (output resistance of the transistor the transconductance of which is sought to be controlled), . . . , etc.) in the gain control characteristic of the I VGA 510 and Q VGA 530.

In an exemplary embodiment, the bias DAC 450 is used as an open loop circuit to compensate for the transistor characteristic vs gate voltage. For example, for transistor devices that follow a perfect square law, Gm is linearly proportional to the over drive voltage $V_{OD}$=($V_{GS}$−$V_T$). An implementation with a linear DAC can provide this control voltage to control the Gm of an ideal square law device. However, there are at least two circumstances in which this does not work perfectly. A first circumstance is where the device is not a perfectly square law device. The drain current ($I_D$) vs $V_{GS}$ characteristic deviates from this at both low and high $V_{GS}$, and this is especially true for short channel devices which are used to provide amplification at very high radio frequencies. Another circumstance is in a radio frequency (RF) amplifier, where the amplifiers are conjugately matched and the power gain is not only determined by Gm but also by the output resistance, ro, which is also a function of $I_D$ or $V_{GS}$. This may make the power gain vs ($V_{GS}$−$V_T$) characteristic non-linear even though the device is a perfectly square law device. A non-linear bias DAC can be used to match the digital control code to output voltage characteristic to compensate for this non-linear VGA gain control characteristic.

The gain control signal generator circuit 400 provides a PVT robust gain control circuit for a trans-linear I/Q vector modulator of which FIG. 5 is an exemplary embodiment to enable sub-THz phase control with high resolution and accuracy.

In an exemplary embodiment, the gain control signal generator circuit 400 provides an improved constant Gm bias core that closely matches the operating conditions of the transistor devices in the I VGA 510 and the Q VGA 530 being controlled and provides the bias DAC with a reference signal that enables a PVT robust circuit and also provides accurate VGA gain control.

A non-linear bias DAC further compensates for VGA gain control non-linearity, improving phase resolution and gain/phase accuracy of an I/Q vector modulator based phase shifter, as described above.

In an exemplary embodiment, based on reference signals from the constant transconductance (Gm) bias circuit 410, the bias DAC provides control voltages referenced to $V_{OD}$, which is in turn derived from R=1/Gm (of the constant transconductance (Gm) bias circuit 410), thus ensuring PVT robustness.

FIG. 5 is a schematic diagram of a phase shifter circuit 500 that can be biased with the gain control signal generator circuit 400 of FIG. 4. In an exemplary embodiment, the phase shifter circuit 500 comprises an in phase (I) quadrature (Q) generator 501, an in phase (I) VGA 510, a quadrature (Q) VGA 530 and a combining circuit 570. In an exemplary embodiment, the I VGA 510 and the Q VGA 530 may each be referred to as a vector modulator.

In an exemplary embodiment, the I/Q generator 501 may receive a differential input signal at connections 504 and 505. In an exemplary embodiment, an in phase positive component (Iin+ or Iinp) of a differential signal may be provided on connection 506 and an in phase negative component (Iin−, or Iinn) of a differential signal may be provided on connection 507.

In an exemplary embodiment, a quadrature positive component (Qin+ or Qinp) of a differential signal may be provided on connection 508 and a quadrature negative component (Qin−, or Qinn) of a differential signal may be provided on connection 509.

In other embodiments, a single-ended signal may be provided to the I/Q generator 501 and differential signals may be created using, for example, a balun (not shown). The signals on connections 504 and 505 may come from another amplifier stage, such as from a VGA or a low noise amplifier LNA, or a stage of a VGA or an LNA, such as one of the VGAs or LNAs of FIG. 3.

In an exemplary embodiment, the I/Q generator 501 may be implemented using a polyphase filter, a quadrature hybrid, a Lange coupler, or their lumped element equivalents at millimeter wave to sub-THz frequencies.

In an exemplary embodiment, the I VGA 510 includes transistors 514, 516, 517 and 518. In an exemplary embodiment, the transistors 514 and 518 may be referred to as "through" transistors and the transistors 516 and 517 may be referred to as "cross" transistors. In the example shown in FIG. 5, the transistors 514, 516, 517 and 518 are all N-type field effect transistors (N-FETs). However, the transistors 514, 516, 517 and 518 can alternatively be P-type FETs, or can be fabricated using other manufacturing technology and processes. In an exemplary embodiment, the scaled replica transistors 420 and 433 in the constant transconductance (Gm) bias circuit 410 should be the same type as the transistors 514, 516, 517 and 518.

The drain of the transistor 514 is connected to the drain of the transistor 517, both of which are connected to node 528 and the connection 552. The drain of the transistor 516 is connected to the drain of the transistor 518, both of which are connected to node 529 and the connection 554.

The source of the transistors 514, 516, 517 and 518 are connected to system ground, which is the same system ground shown in FIG. 4.

A gate of the transistor 514 is connected to a node 521 between a resistance 561 and a capacitance 566. The other side of the resistance 561 is connected to the voltage $V_{GTI}$ on connection 484. The other side of the capacitance 566 is connected to a node 526, which is connected to the Iin+ signal on connection 506.

A gate of the transistor 516 is connected to a node 522 between a resistance 562 and a capacitance 567. The other side of the resistance 562 is connected to the voltage $V_{GXI}$ on connection 486. The other side of the capacitance 567 is connected to the node 526, which is connected to the Iin+ signal on connection 506.

A gate of the transistor 517 is connected to a node 523 between a resistance 563 and a capacitance 568. The other side of the resistance 563 is connected to the voltage $V_{GXI}$ on connection 486. The other side of the capacitance 568 is connected to the node 527, which is connected to the Iin− signal on connection 507.

A gate of the transistor 518 is connected to a node 524 between a resistance 564 and a capacitance 569. The other side of the resistance 564 is connected to the voltage $V_{GTI}$ on connection 484. The other side of the capacitance 569 is connected to the node 527, which is connected to the Iin− signal on connection 507.

In an exemplary embodiment, the Q VGA 530 includes transistors 534, 536, 537 and 538. In an exemplary embodiment, the transistors 534 and 538 may be referred to as "through" transistors and the transistors 536 and 537 may be referred to as "cross" transistors. In the example shown in FIG. 5, the transistors 534, 536, 537 and 538 are all N-type field effect transistors (N-FETs). However, the transistors 534, 536, 537 and 538 can alternatively be P-type FETs, or can be fabricated using other manufacturing technology and processes. In an exemplary embodiment, the scaled replica transistors 420 and 433 in the constant transconductance (Gm) bias circuit 410 should be the same type as the transistors 534, 536, 537 and 538.

The drain of the transistor 534 is connected to the drain of the transistor 537, both of which are connected to node 533 and the connection 556. The drain of the transistor 536 is connected to the drain of the transistor 538, both of which are connected to node 535 and the connection 558.

A gate of the transistor 534 is connected to a node 541 between a resistance 571 and a capacitance 576. The other side of the resistance 571 is connected to the voltage $V_{GTQ}$ on connection 494. The other side of the capacitance 576 is connected to a node 531, which is connected to the Qin+ signal on connection 508.

A gate of the transistor 536 is connected to a node 542 between a resistance 572 and a capacitance 577. The other side of the resistance 572 is connected to the voltage $V_{GXQ}$ on connection 496. The other side of the capacitance 577 is connected to the node 531, which is connected to the Qin+ signal on connection 508.

A gate of the transistor 537 is connected to a node 543 between a resistance 573 and a capacitance 578. The other side of the resistance 573 is connected to the voltage $V_{GXQ}$ on connection 496. The other side of the capacitance 578 is connected to the node 532, which is connected to the Qin-signal on connection 509.

A gate of the transistor 538 is connected to a node 544 between a resistance 574 and a capacitance 579. The other side of the resistance 574 is connected to the voltage $V_{GTQ}$ on connection 494. The other side of the capacitance 579 is connected to the node 532, which is connected to the Qin-signal on connection 509.

An Iout+ output of the I VGA 510 is provided over connection 552 and an Iout-output of the I VGA 510 is provided over connection 554. A Qout+ output of the Q VGA 530 is provided over connection 556 and a Qout− output of the Q VGA 530 is provided over connection 558.

The combining circuit 570 includes a first winding 583 and a second winding 584. The Iout+ output on connection 552 and the Qout+ output on connection 556 are provided to a node 586, which is connected to one side of the first winding 583. The Iout-output on connection 554 and the Qout− output on connection 558 are provided to a node 587, which is connected to the other side of the first winding 583. A center tap of the first winding 583 is connected to the system voltage $V_D$.

The combining circuit 570 is illustrated as a transformer for illustrative purposes only. The combining circuit 570 may be implemented in other ways, such as by using a Wilkinson combiner, or other circuit. In an exemplary embodiment, the center tap connection of the first winding 583 to the supply voltage, $V_D$, corresponds to the supply voltage, $V_D$, on connections 413 and 442 in FIG. 4. Regardless of the implementation of the combining circuit 570, it may provide a DC path for the supply voltage $V_D$ to the transistor devices in the I VGA 510 and Q VGA 530.

Moreover, connecting Iout+ and Qout+ together at node 586 and connecting Iout− and Qout− together at node 587 is somewhat arbitrary. These connections determine the mapping between the control words $CW_I[N-1]$, $CW_Q[N-1]$ and the quadrants selected. For example, Iout+ and Qout− may be coupled together and Iout− and Qout+ may be coupled together, so long as I and Q are coupled together.

The phase shift imparted by the phase shifter circuit 500 in the exemplary embodiment is determined by the gate bias on the active devices 514, 516, 517, 518, 534, 536, 537 and 538.

Figure 6:
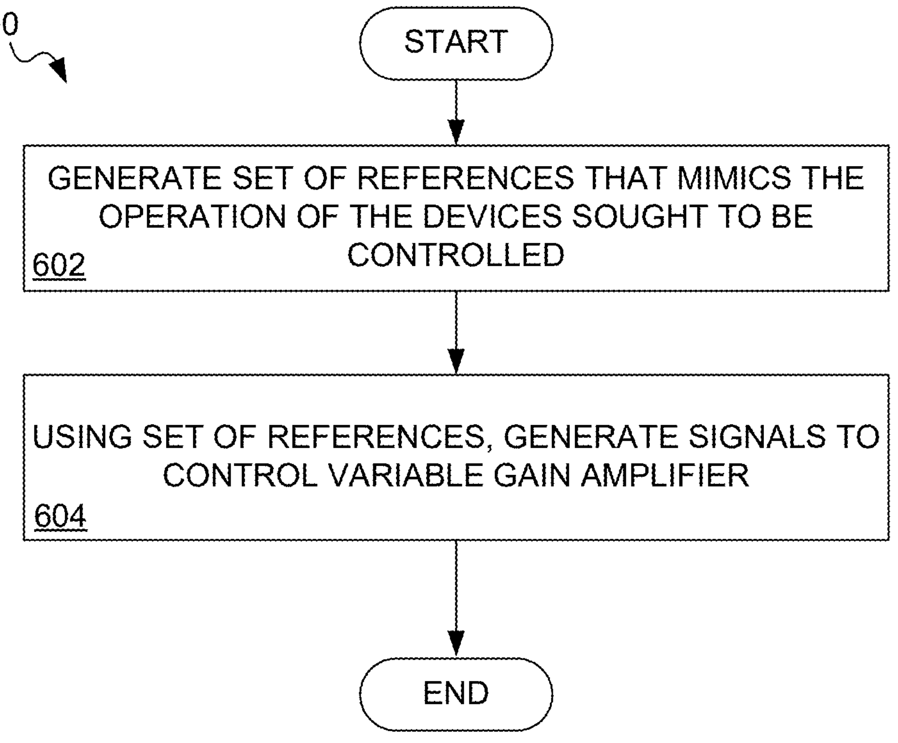
FIG. 6 is a flow chart describing an example of the operation of a method for biasing a phase shifter.

FIG. 6 is a flow chart 600 describing an example of the operation of a method for biasing a variable gain amplifier. The blocks in the method 600 can be performed in or out of the order shown, and in some embodiments, can be performed at least in part in parallel.

In block 602, a set of references is generated that mimics the operation of the devices sought to be controlled. For example, the constant transconductance (Gm) bias circuit 410 generates a set of references having voltage values between $V_T$ and $V_T+2V_{OD}$ including a reference voltage $V_T+V_{OD}$ on connection 444 and a reference current I that produces $0.5V_{OD}$ across resistor 437 that mimics the operation of the transistor devices in the I VGA 510 and the Q VGA 530.

In block 604, the set of references is used to generate gain control signals to control variable gain amplifiers. For example, with a reference voltage $V_T+V_{OD}$ on connection 444 and current I, the bias DAC 450 may generate control signals $V_{GTI}$, $V_{GXI}$, $V_{GTQ}$ and $V_{GXQ}$ using symmetrical nonequal value resistor string ($[R_{2^{N-1}-2}, \ldots, R_0]$) in the resistor bank 454 to compensate for residual non-linearities in the gain control characteristic of the I VGA 510 and Q VGA 530.

Figure 7:
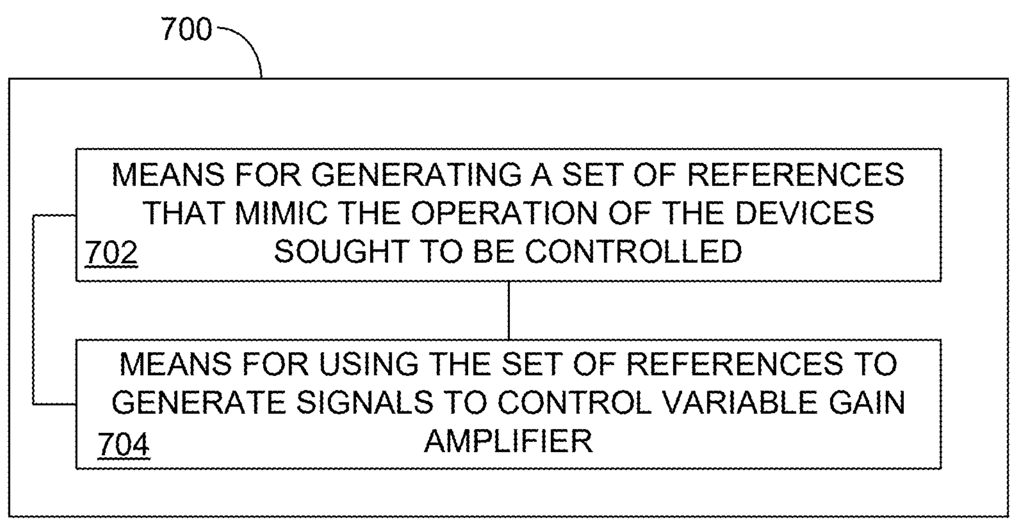
FIG. 7 is a functional block diagram of an apparatus for biasing a phase shifter.

FIG. 7 is a functional block diagram of an apparatus 700 for biasing a variable gain amplifier. The apparatus 700 comprises means 702 for generating a set of references that mimics the operation of the devices sought to be controlled. In certain embodiments, the means 702 for generating a set of references that mimics the operation of the devices sought to be controlled can be configured to perform one or more of the functions described in operation block 602 of method 600 (FIG. 6). In an exemplary embodiment, the means 702 for generating a set of references that mimics the operation of the devices sought to be controlled may comprise the constant transconductance (Gm) bias circuit 410 configured to generate a set of references having voltage values between $V_T$ and $V_T+2V_{OD}$ including a reference voltage $V_T+V_{OD}$ on connection 444 and a reference current I that produces $0.5V_{OD}$ across resistor 437 that mimics the operation of the transistor devices in the I VGA 510 and the Q VGA 530.

The apparatus 700 may also comprise means 704 for using the set of references to generate gain control signals to control variable gain amplifiers. In certain embodiments, the means 704 for using the set of references to generate gain control signals to control variable gain amplifiers can be configured to perform one or more of the functions described in operation block 604 of method 600 (FIG. 6). In an exemplary embodiment, the means 704 for using the set of references to generate gain control signals to control variable gain amplifiers may comprise the bias DAC 450 configured to generate control voltages $V_{GTI}$, $V_{GXI}$, $V_{GTQ}$ and $V_{GXQ}$ using symmetrical nonequal value resistor string ($[R_{2^{N-1}-2}, \ldots, R_0]$) in the resistor bank 454 to compensate for residual non-linearities in the gain control characteristic of the I VGA 510 and Q VGA 530.

Implementation examples are described in the following numbered clauses:

1. An active phase shifter, comprising: a gain control signal generator circuit having a constant transconductance (Gm) bias circuit and a bias digital-to-analog converter (DAC); and a vector modulator configured to receive bias outputs of the gain control signal generator circuit.

2. The phase shifter of clause 1, wherein the constant transconductance (Gm) bias circuit comprises transistor devices that mimic operation of transistor devices in the vector modulator.

3. The phase shifter of any of clauses 1 through 2, wherein the constant transconductance (Gm) bias circuit provides a set of references to the bias DAC, the set of references generated by devices that mimic operation of transistor devices in the vector modulator.

4. The phase shifter of clause 3, wherein the set of references comprises a reference voltage, $V_T+V_{OD}$, and a reference current I that produces a proportional voltage, $V_{OD}$/sqrt(n) across a resistor in the constant transconductance (Gm) bias circuit.

5. The phase shifter of clause 4, wherein the set of references comprises voltage values between $V_T$ and $V_T+2V_{OD}$ and is used to generate the bias outputs to the vector modulator.

6. The phase shifter of any of clauses 1 through 5, wherein the bias DAC comprises a resistor bank having symmetrical nonequal resistances comprising resistance values $R_0$ to $R_{2^{N-1}-2}$ where the resistances are symmetrical with respect to a center node of the resistor bank and where "N" represents a number of bits in a control word for the phase shifter.

7. The phase shifter of clause 6, wherein the bias DAC comprises a non-linear bias DAC configured to provide the bias outputs to an in phase variable gain amplifier (I VGA) and a quadrature VGA (Q VGA) in the vector modulator.

8. The phase shifter of any of clauses 1 through 7, wherein the gain control signal generator circuit is configured to provide bias voltages to control the vector modulator for frequencies including sub-THz frequencies.

9. The phase shifter of any of clauses 2 through 8, wherein the transistor devices in the constant transconductance (Gm) bias circuit comprise a first transistor and a second transistor configured to generate a gate-source voltage ($V_{GS}$) proportional to a size ratio between the first transistor and the second transistor.

10. The phase shifter of clause 9, wherein the first transistor and the second transistor are N-type devices configured in a common source arrangement.

11. The phase shifter of clause 10, wherein gates of the first transistor and second transistor are connected to respective inputs of a first operational transconductance amplifier (OTA), wherein drains of the first and second transistors are coupled via respective resistors to respective P-type devices arranged in a common source configuration forming a matched current mirror, wherein an output of the first OTA is connected to an output of a second OTA, and wherein inputs of the second OTA are connected across the resistance coupled to the first transistor.

12. The phase shifter of clause 11, further comprising a first amplifier having an inverting input connected to a supply voltage, a non-inverting input connected to the drain of the first transistor, and an output connected to the gate of the first transistor, the phase shifter further comprising a second amplifier having an inverting input connected to the supply voltage, a non-inverting input connected to the drain of the second transistor, and an output connected to the gate of the second transistor.

13. A method for biasing a phase shifter, comprising: generating a set of references that mimic operation of devices sought to be controlled in a vector modulator; and using the set of references to generate control signals to control the vector modulator.

14. The method of clause 13, further comprising generating the control signals that control the vector modulator using a bias digital-to-analog converter (DAC).

15. The method of any of clauses 13 through 14, wherein the set of references comprises a reference voltage, $V_T+V_{OD}$, and current I that produces a proportional voltage, $V_{OD}$/sqrt(n) across a resistor, where "n" represents a relative size ratio between transistors in a constant transconductance (Gm) bias circuit used to generate the set of references.

16. The method of any of clauses 13 through 15, further comprising generating the bias outputs to the vector modulator based on the set of references.

17. The method of any of clauses 14 through 16, wherein the bias DAC comprises a resistor bank having symmetrical nonequal resistances comprising resistance values $R_0$ to $R_{2^{N-1}-2}$ where the resistances are symmetrical with respect to a center node of the resistor bank and where "N" represents a number of bits in a control word for the phase shifter.

18. The method of any of clauses 13 through 17, further comprising providing the control signals to control an in phase variable gain amplifier (I VGA) and a quadrature VGA (Q VGA) in the vector modulator.

19. The method of any of clauses 13 through 18, further comprising providing the control signals to control the vector modulator for frequencies including sub-THz frequencies.

20. A device, comprising: means for generating a set of references that mimic operation of devices sought to be controlled in a vector modulator; and means for using the set of references to generate control signals to control the vector modulator.

21. The device of clause 20, further comprising means for generating the control signals that control the vector modulator using a bias digital-to-analog converter (DAC).

22. The device of any of clauses 20 through 21, wherein the set of references comprises a reference voltage, $V_T+V_{OD}$, and current I that produces a proportional voltage, $V_{OD}$/sqrt(n) across a resistor, where "n" represents a relative size ratio between transistors in the means for generating.

23. The device of any of clauses 20 through 22, further comprising means for generating the bias outputs to the vector modulator based on the set of references.

24. The device of any of clauses 20 through 23, wherein the bias DAC comprises resistor means having symmetrical nonequal resistances that comprise resistances $R_0$ to $R_{2^{N-1}-2}$.

25. The device any of clauses 20 through 24, further comprising means for providing the control signals to control an in phase variable gain amplifier (I VGA) and a quadrature VGA (Q VGA) in the vector modulator.

26. The device of any of clauses 20 through 25, further comprising means for providing the control signals to control the vector modulator for frequencies including sub-THz frequencies.

27. A phase shifter, comprising: an in phase (I) quadrature phase (Q) generator; a vector modulator having an I variable gain amplifier (I VGA) and a quadrature (Q VGA), the I VGA and the Q VGA configured to receive bias signals from a gain control signal generator circuit having a constant transconductance (Gm) bias circuit and a bias digital-to-analog converter (DAC); and a combining circuit connected to outputs of the I VGA and the Q VGA.

28. The phase shifter of clause 27, wherein the constant transconductance (Gm) bias circuit comprises transistor devices that mimic operation of transistor devices in the I VGA and in the Q VGA.

29. The phase shifter of any of clauses 27 through 28, wherein the constant transconductance (Gm) bias circuit provides a set of references to the bias DAC, the set of references generated by devices that mimic operation of transistor devices in the I VGA and in the Q VGA.

30. The phase shifter of any of clauses 27 through 29, wherein the set of references comprises a reference voltage, $V_T+V_{OD}$, and current I that produces a proportional voltage, $V_{OD}$/sqrt(n) across a resistor.

31. The phase shifter of any of clauses 27 through 30, wherein the bias DAC comprises a resistor bank having symmetrical nonequal resistances that comprise resistances $R_0$ to $R_{2^{N-1}-2}$.

32. The phase shifter of any of clauses 27 through 31, wherein the symmetrical nonequal resistances comprising resistances $R_0$ to $R_{2^{N-1}-2}$ are symmetrical with respect to a center node of the resistor bank.

33. The phase shifter of any of clauses 27 through 32, wherein the bias DAC comprises a non-linear bias DAC configured to provide the bias outputs to the I VGA and the Q VGA.

34. The phase shifter of any of clauses 27 through 33, wherein the gain control signal generator circuit is configured to provide bias voltages to the vector modulator for frequencies including sub-THz frequencies.

The circuit architecture described herein may be implemented on one or more ICs, analog ICs, RFICs (RF ICs), mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. An active phase shifter, comprising:

a gain control signal generator circuit having a constant transconductance (Gm) bias circuit and a bias digital-to-analog converter (DAC); and a vector modulator configured to receive bias outputs of the gain control signal generator circuit.

2. The phase shifter of claim 1, wherein the constant transconductance (Gm) bias circuit comprises transistor devices that mimic operation of transistor devices in the vector modulator.

3. The phase shifter of claim 1, wherein the constant transconductance (Gm) bias circuit provides a set of references to the bias DAC, the set of references generated by devices that mimic operation of transistor devices in the vector modulator.

4. The phase shifter of claim 3, wherein the set of references comprises a reference voltage, $V_T+V_{OD}$, and a reference current I that produces a proportional voltage, $V_{OD}$/sqrt(n) across a resistor in the constant transconductance (Gm) bias circuit.

5. The phase shifter of claim 4, wherein the set of references comprises voltage values between $V_T$ and $V_T+2V_{OD}$ and is used to generate the bias outputs to the vector modulator.

6. The phase shifter of claim 1, wherein the bias DAC comprises a resistor bank having symmetrical nonequal resistances comprising resistance values $R_0$ to $R_{2^{N-1}-2}$ where the resistances are symmetrical with respect to a center node of the resistor bank and where "N" represents a number of bits in a control word for the phase shifter.

7. The phase shifter of claim 6, wherein the bias DAC comprises a non-linear bias DAC configured to provide the bias outputs to an in phase variable gain amplifier (I VGA) and a quadrature VGA (Q VGA) in the vector modulator.

8. The phase shifter of claim 1, wherein the gain control signal generator circuit is configured to provide bias voltages to control the vector modulator for frequencies including sub-THz frequencies.

9. The phase shifter of claim 2, wherein the transistor devices in the constant transconductance (Gm) bias circuit comprise a first transistor and a second transistor configured to generate a gate-source voltage ($V_{GS}$) proportional to a size ratio between the first transistor and the second transistor.

10. The phase shifter of claim 9, wherein the first transistor and the second transistor are N-type devices configured in a common source arrangement.

11. The phase shifter of claim 10, wherein gates of the first transistor and second transistor are connected to respective inputs of a first operational transconductance amplifier (OTA), wherein drains of the first and second transistors are coupled via respective resistors to respective P-type devices arranged in a common source configuration forming a matched current mirror, wherein an output of the first OTA is connected to an output of a second OTA, and wherein inputs of the second OTA are connected across the resistance coupled to the first transistor.

12. The phase shifter of claim 11, further comprising a first amplifier having an inverting input connected to a supply voltage, a non-inverting input connected to the drain of the first transistor, and an output connected to the gate of the first transistor, the phase shifter further comprising a second amplifier having an inverting input connected to the supply voltage, a non-inverting input connected to the drain of the second transistor, and an output connected to the gate of the second transistor.

13. A method for biasing a phase shifter, comprising:

generating a set of references that mimic operation of devices sought to be controlled in a vector modulator; and using the set of references to generate control signals to control the vector modulator.

14. The method of claim 13, further comprising generating the control signals that control the vector modulator using a bias digital-to-analog converter (DAC).

15. The method of claim 13, wherein the set of references comprises a reference voltage, $V_T+V_{OD}$, and current I that produces a proportional voltage, $V_{OD}$/sqrt(n) across a resistor, where "n" represents a relative size ratio between transistors in a constant transconductance (Gm) bias circuit used to generate the set of references.

16. The method of claim 14, wherein the bias DAC comprises a resistor bank having symmetrical nonequal resistances comprising resistance values $R_0$ to $R_{2^{N-1}-2}$ where the resistances are symmetrical with respect to a center node of the resistor bank and where "N" represents a number of bits in a control word for the phase shifter.

17. The method of claim 13, further comprising providing the control signals to control an in phase variable gain amplifier (I VGA) and a quadrature VGA (Q VGA) in the vector modulator.

18. The method of claim 13, further comprising providing the control signals to control the vector modulator for frequencies including sub-THz frequencies.

19. A device, comprising:

means for generating a set of references that mimic operation of devices sought to be controlled in a vector modulator; and means for using the set of references to generate control signals to control the vector modulator.

20. The device of claim 19, further comprising means for generating the control signals that control the vector modulator using a bias digital-to-analog converter (DAC).

* * * * *